(12) United States Patent
Perreault et al.

(10) Patent No.: US 7,589,605 B2
(45) Date of Patent: Sep. 15, 2009

(54) METHOD AND APPARATUS TO PROVIDE COMPENSATION FOR PARASITIC INDUCTANCE OF MULTIPLE CAPACITORS

(75) Inventors: David J. Perreault, Brookline, MA (US); Brandon J. Pierquet, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 183 days.

(21) Appl. No.: 11/354,628

(22) Filed: Feb. 15, 2006

(65) Prior Publication Data

US 2007/0188265 A1   Aug. 16, 2007

(51) Int. Cl.
*H03H 7/00* (2006.01)
*H04B 3/28* (2006.01)

(52) U.S. Cl. .................... 333/177; 333/12; 333/181; 333/185

(58) Field of Classification Search .............. 333/12, 333/177, 181, 185
See application file for complete search history.

(56) References Cited

U.S. PATENT DOCUMENTS

| | | | |
|---|---|---|---|
| 1,920,948 A | 8/1933 | Crouse | |
| 3,465,267 A | 9/1969 | Carlson, Jr. | |
| 4,422,059 A | 12/1983 | Fuji et al. | |
| 4,451,804 A | 5/1984 | Veisz et al. | |
| 4,577,145 A | 3/1986 | Mullersman | |
| 5,038,263 A | 8/1991 | Marrero et al. | |
| 5,061,913 A * | 10/1991 | Okochi et al. | 333/181 |
| 5,083,101 A * | 1/1992 | Frederick | 333/181 |
| 5,148,360 A | 9/1992 | Nguyen | |
| 5,495,405 A | 2/1996 | Fujimura et al. | |
| 5,694,297 A | 12/1997 | Smith et al. | |
| 5,761,049 A | 6/1998 | Yoshidome et al. | |
| 6,239,557 B1 | 5/2001 | Chang et al. | |
| 6,476,689 B1 | 11/2002 | Uchida et al. | |
| 6,529,363 B2 | 3/2003 | Waffenschmidt et al. | |
| 2006/0077018 A1 | 4/2006 | Perreault et al. | |
| 2006/0132257 A1 | 6/2006 | Wang et al. | |

FOREIGN PATENT DOCUMENTS

| | | |
|---|---|---|
| JP | 062240458 A | 12/1994 |
| JP | 2001160728 A | 12/2001 |
| WO | WO 91/10285 | 7/1991 |
| WO | WO 03/073608 A1 | 9/2003 |

OTHER PUBLICATIONS

Neugebauer et al., "Filters With Inductance Cancellation Using Printed Circuit Board Transformer", IEEE Trans. on power Electronics, vol. 19, No. 3, May 2004, pp. 591-602.*
Shuo Wang, Effects of Parasitic Parameters on EMI Filter Performance, May 2004, pp. 869-877, vol. 19, No. 3, Blacksburg, VA.
Shuo Wang, Using a Network Method to Reduce the Parasitic Parameters of Capacitors, 2004 35th Annual IEE Power Electronics Specialists Conference, Aachen, Germany, pp. 304-308, 2004, Blacksburg, VA.
PCT/US2007/001515 International Search Report dated Jun. 11, 2007.

(Continued)

*Primary Examiner*—Benny Lee
*Assistant Examiner*—Kimberly E Glenn
(74) *Attorney, Agent, or Firm*—Daly, Crowley, Mofford & Durkee, LLP

(57) ABSTRACT

A coupled winding cancels parasitic inductance of first and second capacitors. In an EMI filter having common mode capacitors and a differential capacitors, first and second windings cancel parasitic inductance of the common mode and differential capacitors.

20 Claims, 19 Drawing Sheets

OTHER PUBLICATIONS

T.K. Phelps and W.S. Tate, Optimizing Passive Input Filter Design, Process of the 6th National Solid State Power Conversion Conference Powercon 6), May 1979, pp. G1-1-G1-10.

David C. Hamill, Philip T. Krein, A Zero Ripple Technique Applicable To Any DC Converter, , 1999 IEEE Power Electronics Specialists Conference, pp. 1165-1171.

Johann W. Kolar, Hari Sree, Ned Mohan, Franz C. Zach, Novel Aspects of an Application of 'Zero'-Ripple Techniques to Basic Converter Topologies, 1997 IEEE Power Electronics Specialists Conference, pp. 796-803.

Sam Y. M. Feng, William A. Sander, III and Thomas G. Wilson, Small-Capacitance Nondissipative Ripple Filters for DC Supplies, IEEE Transactions on Magnetics, Mar. 1970, pp. 137-142.

Steven Senini, Peter J. Wolfs, The Coupled Inductor Filter: Analysis and Design for AC Systems, IEEE Transactions on Idustrial Electronics, vol. 45, No. 4, Aug. 1998, pp. 574-578.

Slobodan Cuk, A New Sero-Ripple Switching DC-to-DC Converter and Integrated Magnetics, IEEE Transactions on Magnetics on Magnetics, vol. MAG-19, No. 2, Mar. 1983, pp. 57-75.

D.L. Logue and P.T. Krein, Optimization of Power Electronic Systems Using Ripple Correlation Control: A Dynamioc Programming Approach, 2001 IEEE Power Electronics Specialists Conference, pp. 459-464.

Robert A. Heartz, Herbert Buelteman, Jr., The Application of Perpendicularly Superposed Magnetic Fields, AIEE Trans. Pt. 1, Nov. 1955, vol. 74, pp. 655-660.

H. J. McCreary, The Magnetic Cross Valve, AIEE Transactions, vol. 70, Pt. II, pp. 1868-1875, 1951.

Joshua W. Phinney, Filters with Active Tuning for Power Applications, May 30, 2002, pp. 1-133.

Powering the Future: New Opportunities in Power Electronics, MIT Laboratory for Electromagnetic and Electronic Systems, Apr. 10, 2001, pp. 1-42.

PCT International Search Report PCT/US 02/37961, Filed Nov. 27, 2002.

File downloaded from PAIR for U.S. Appl. No. 10/082,616, filed Feb. 25, 2002, U.S. Patent No. 6,937,115, issued Aug. 30, 2005.

File downloaded from PAIR for U.S. Appl. No. 11/119,659, filed May 2, 2005, U.S. Patent No. 7,242,269, issued Jul. 10, 2007.

* cited by examiner

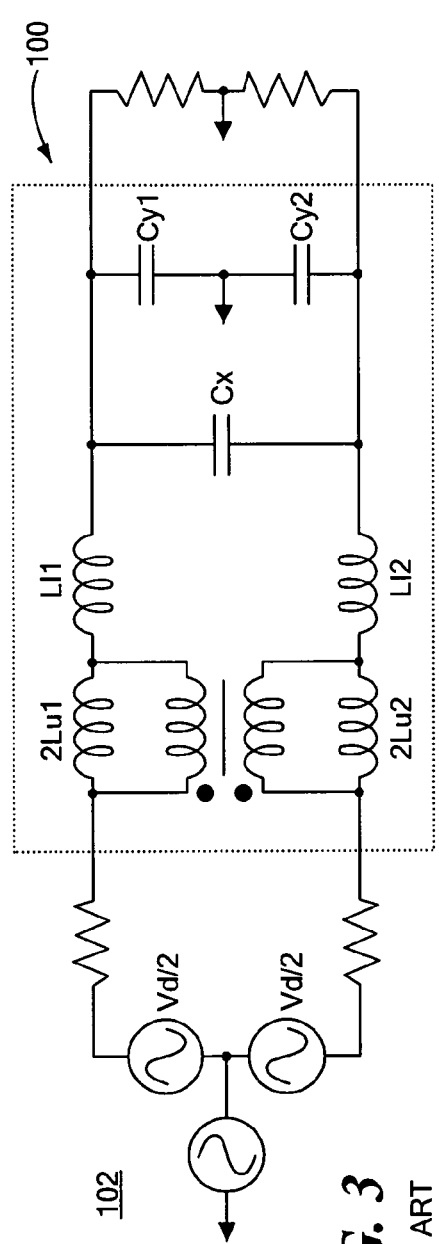
FIG. 3
PRIOR ART
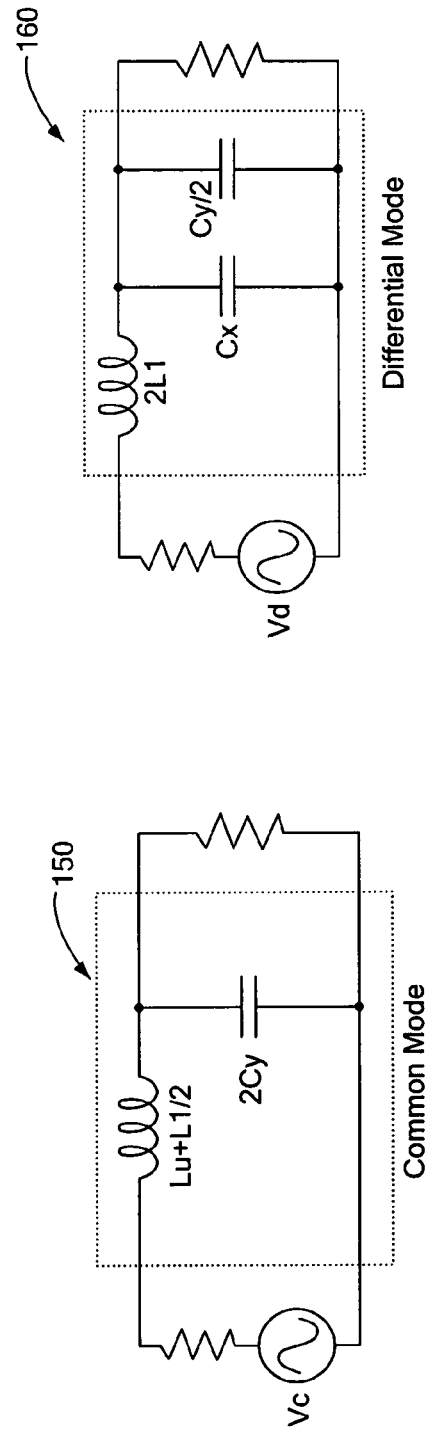
FIG. 4B
PRIOR ART
FIG. 4A
PRIOR ART Same Direction Opposite Direction Physical Layout Physical Layout

METHOD AND APPARATUS TO PROVIDE COMPENSATION FOR PARASITIC INDUCTANCE OF MULTIPLE CAPACITORS

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

As is known in the art, electromagnetic interference (EMI) filters are used in many types of electrical equipment. Such filters play a role in meeting federal regulations for device compatibility, for example. The size and performance of these filters are often limited by filter capacitor parasitics, such as the equivalent series inductance (ESL) associated with magnetic energy storage in the capacitor and interconnects. Coupled magnetic windings can be used to compensate for the effects of parasitic inductance of capacitors, reducing the filter volume and increasing its attenuation performance.

FIG. 1A shows a prior art LC low pass filter LPF having a capacitor C and an inductor L. FIG. 1B shows the filter of FIG. 1a with a high-frequency model 20 of the capacitor C. The high frequency capacitor model 20 includes the equivalent series inductance ESL and resistance R of the capacitor. These parasitics cause non-ideal filter behavior at high-frequencies as the capacitor impedance is no longer dominated by its capacitance. The filter attenuation performance is determined by the impedance mismatch between the series and shunt paths. At frequencies beyond the resonant frequency of the capacitor C, the shunt path impedance increases, and the filter LPF performance degrades as compared to the ideal LC filter.

It is known to use coupled magnetic windings to compensate for the effect of the parasitic inductance of the filter capacitor, greatly improving high-frequency filter performance. U.S. Pat. No. 6,937,115 to Perreault et al., for example, which is incorporated herein by reference, discloses a coupled inductor structure used to induce a voltage that counteracts the voltage due to the capacitor equivalent series inductance. This effect arises from the mutual coupling of the magnetic windings and appears as a negative branch inductance in the equivalent "T" model of the coupled magnetic windings. The negative branch inductance is used to compensate for the device parasitic inductance, creating a three terminal component with drastically reduced equivalent shunt path inductance.

FIGS. 2A and 2B show a prior art compensated LC low-pass filter having inductance cancellation with the coupled magnetic winding represented by its equivalent "T" model. An implementation of this inductance cancellation method has been found to be effective for improving the performance of high frequency filters, such as those used in limiting electromagnetic interference (EMI). FIG. 2A shows an unsimplified equivalent circuit for the filter and FIG. 2B shows an equivalent simplified version.

While the inductive component of a single capacitor can be cancelled as described above, providing coupled windings for each capacitor in a circuit can require significant real estate.

SUMMARY OF THE INVENTION

In one aspect of the invention, a filter comprises first and second capacitors, and a circuit coupled to the first and second capacitors, the circuit including discrete magnetically-coupled windings to compensate for equivalent series inductance effects of a first capacitor electrical path including the first capacitor and a second capacitor electrical path including the second capacitor. Induction of the magnetically-coupled windings generates voltages that counteract voltages due to equivalent series inductance of the first and second capacitor electrical paths and do not counteract voltages due to capacitances of the first and second capacitors.

In one embodiment, the coupled windings nullify the equivalent series inductance of the first capacitor electrical path. It is understood that for purposes of this document nullify is a subset of compensate where nullify refers to counteracting completely or substantially completely, equivalent series inductance.

In another aspect of the invention, a method of suppressing electrical signals comprises coupling a first capacitor having at least first and second ends to a circuit including discrete magnetically-coupled windings, and coupling a second capacitor having at least first and second ends to the coupled magnetic winding circuit. The coupled windings compensate for an effect of an equivalent series inductance of paths through the first and second capacitors, wherein an effect of the capacitances of the first and second capacitors is not compensated for.

In a further aspect of the invention, a filter comprises a circuit including a first set of discrete magnetically-coupled windings having at least first and second capacitor tap points, a first capacitor having a first end connected to the first capacitor tap point, and a second capacitor having a first end connected to the second capacitor tap point. Induction of the first set of magnetically-coupled windings provides cancellation of an effect of an equivalent series inductance of a first path through the first capacitor and an equivalent series inductance of a second path though the second capacitor path, wherein an effect of capacitances of the first and second capacitors is not cancelled.

BRIEF DESCRIPTION OF THE DRAWINGS

The invention will be more fully understood from the following detailed description taken in conjunction with the accompanying drawings, in which:

FIG. 3 is an equivalent circuit diagram of a prior art EMI filter circuit;

FIG. 4A is a circuit diagram of a common mode model of the circuit of FIG. 3;

FIG. 4B is a circuit diagram of a differential mode model of the circuit of FIG. 3;

DETAILED DESCRIPTION

Figure 1A:
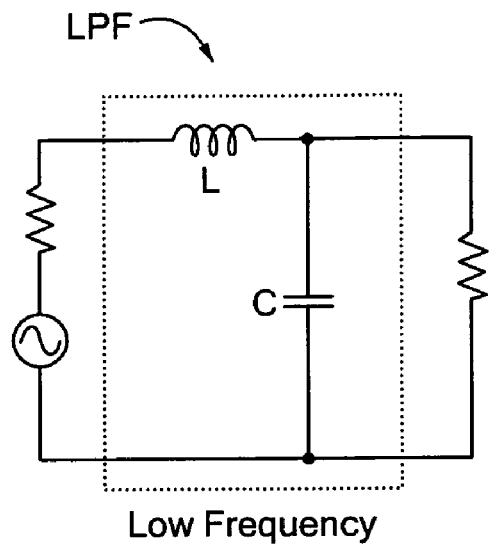
FIG. 1A is a circuit diagram for a prior art low-pass LC filter.
Figure 1B:
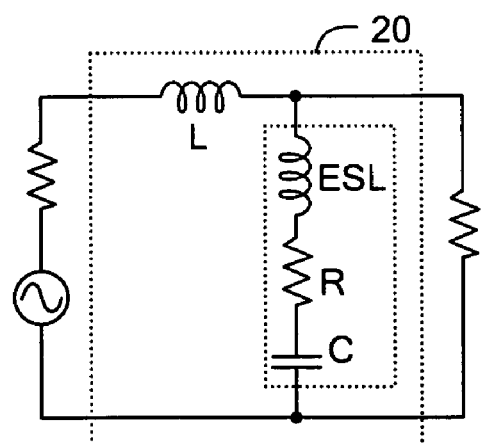
FIG. 1B is an equivalent circuit diagram of the prior art filter of FIG. 1A with a high frequency model of the capacitor.
Figure 2A:
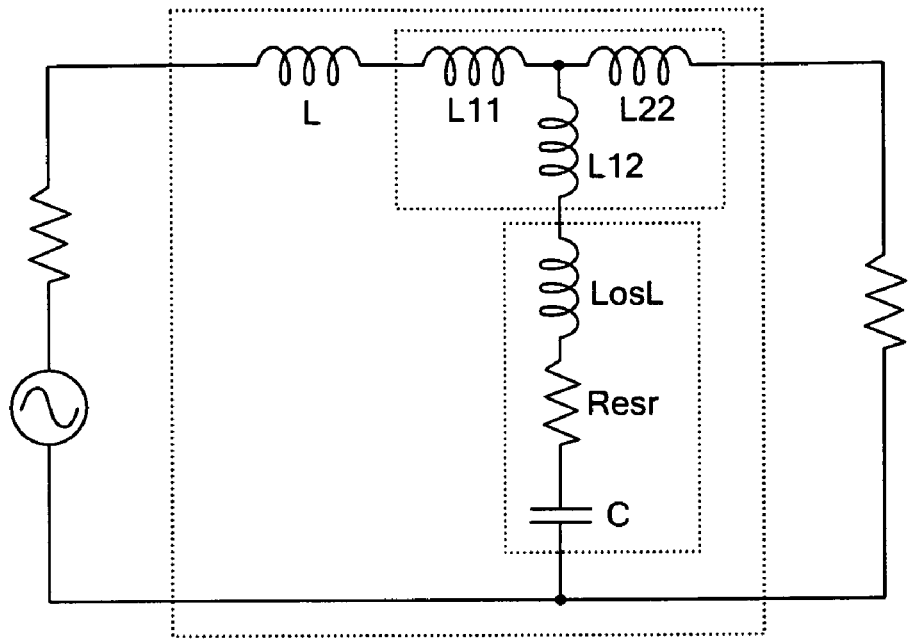
FIG. 2A is an equivalent circuit diagram of a prior art LC low-pass filter having inductance cancellation.
Figure 2B:
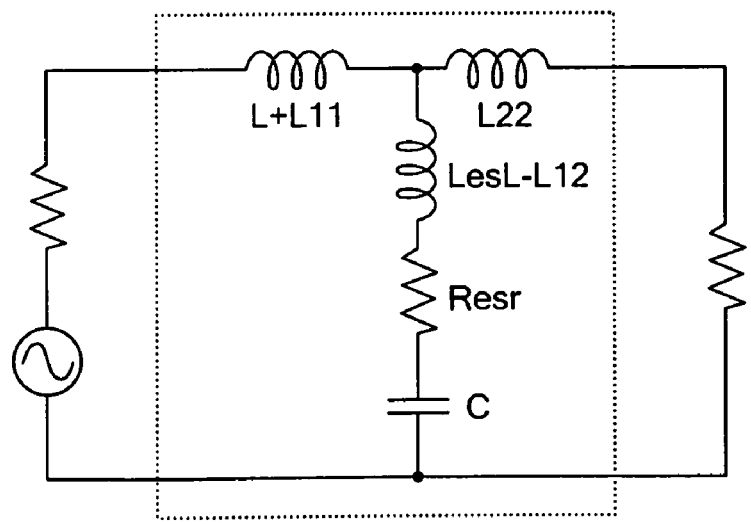
FIG. 2B is a simplified equivalent circuit diagram for the prior art circuit of FIG. 2A.

In general, the present invention provides inductive impedance cancellation for multiple capacitors with a coupled magnetic winding. In an exemplary embodiment, an EMI filter includes capacitors to attenuate both common-mode and differential-mode EMI. The coupled winding nullifies the parasitic effects of the capacitors in a space-efficient and elegant manner.

Before describing the invention in detail, some introductory information is provided. FIG. 3 shows a known EMI filter 100 with a source circuit 102 to energize the filter 100, which can be coupled to a load circuit 104. The source circuit 102 is driven by both common mode and differential mode signals, as shown.

In an exemplary embodiment, the filter 100 includes a common-mode choke modeled with inductive elements L11, L12, L2, 2Lu1, 2Lu2 and capacitive elements, which include a differential capacitor Cx and first and second common mode capacitors Cy1, Cy2. In one particular embodiment, the circuit 100 is analyzed by separating its common mode and differential mode responses and treating these equivalent circuits as independent circuits.

The common and differential mode equivalent circuits 150, 160 are shown in FIGS. 4A and 4B, respectively. The common mode equivalent circuit 150 includes an inductor Lu+L1/2 and a capacitor 2Cy. The differential mode equivalent circuit 160 includes an inductor 2L1 and first and second capacitors Cx/2 and Cy/2 coupled in parallel.

Figure 5:
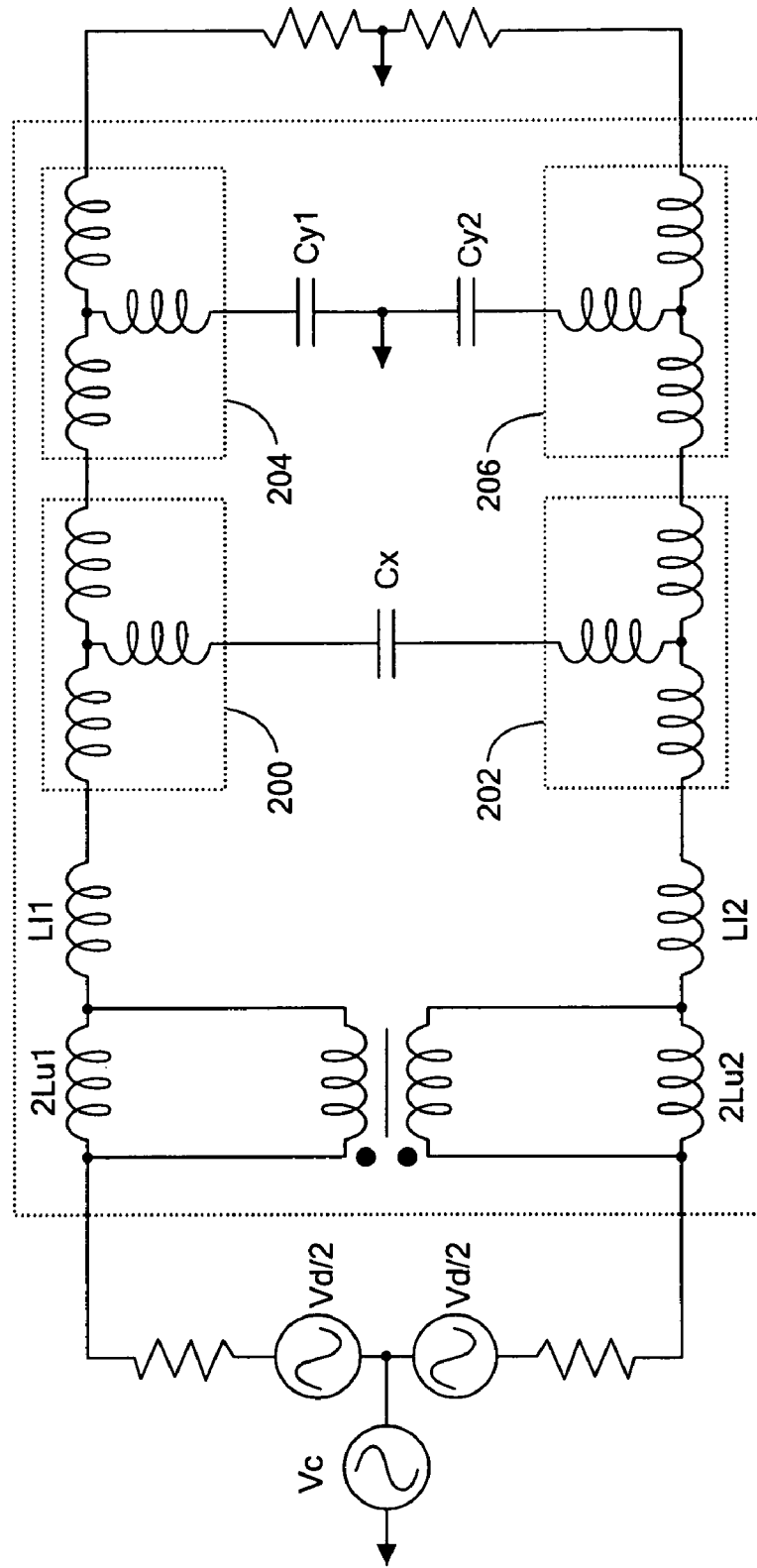
FIG. 5 is an equivalent circuit diagram of an EMI filter circuit having inductance cancellation.
Figure 6:
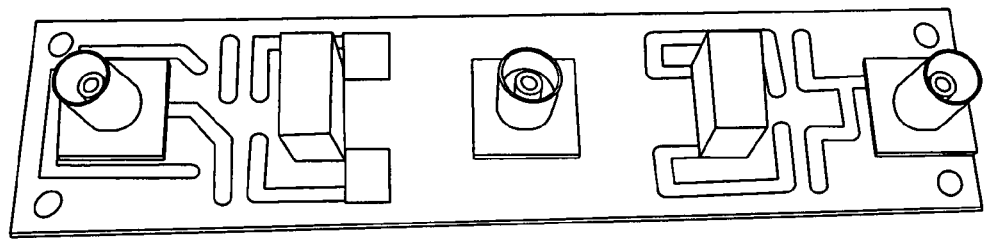
FIG. 6 is a pictorial representation of a prior art circuit implementing balanced inductance cancellation.

FIG. 5 shows the circuit of FIG. 3 with inductance cancellation coils for each capacitor. The differential capacitor Cx is fitted with first and second inductance cancellation coils 200, 202. These cancellation coils 200, 202 are believed to be as effective as a single coil. FIG. 6 shows a prior-art circuit in which first and second inductance cancellation coils are used to cancel the capacitance of a single differential capacitor in a balanced fashion. Returning to FIG. 5, first ends of the common mode capacitors Cy1, Cy2 are coupled to a reference node and third and forth cancellation coils 204, 206 are coupled at the other ends of the capacitors Cy1, Cy2.

Figure 7A:
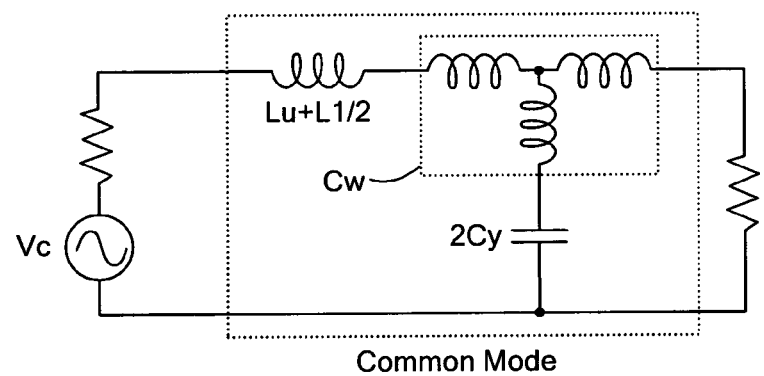
FIG. 7A is a circuit diagram of a common mode model for the circuit of FIG. 5.
Figure 7B:
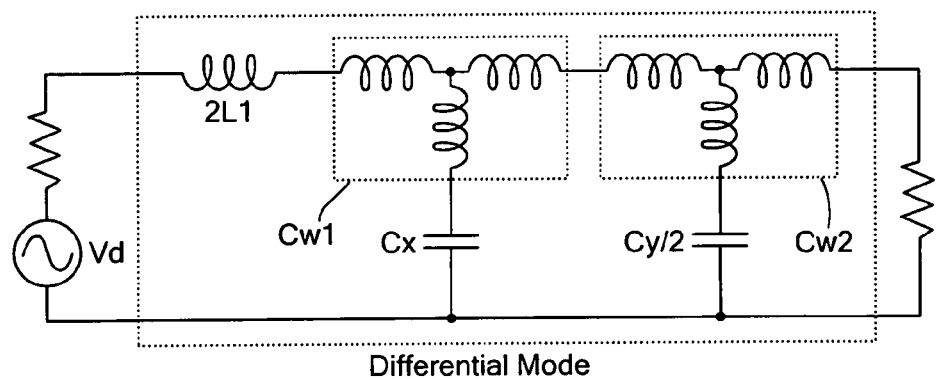
FIG. 7B is a circuit diagram of a differential mode model for the circuit of FIG. 5.

It is understood that the first and second cancellation coils 200, 202 provide a balanced implementation to avoid inserting an unbalanced circuit element within the otherwise balanced system. Without balancing the series inductances on both sides of the differential-mode capacitor Cx, a cross coupling between the differential and common mode signal sources would result. By avoiding this coupling, the common and differential mode circuit equivalents remain straightforward, as illustrated in FIGS. 7A and 7B. The common mode equivalent circuit of FIG. 7A includes an inductor Lu+L1/2, a capacitor 2Cy, and a cancellation winding CW. The differential mode equivalent circuit of FIG. 7B includes an inductor 2L1, first and second capacitors Cx, Cy/2 and respective cancellation windings CW1, CW2. It should be noted that a consideration when physically implementing two balanced cancellation windings for a single capacitor is linked magnetic flux between the two sets of windings, as described below.

Referring again to FIG. 5, the construction of an EMI filter with full, balanced inductance cancellation would require four magnetically coupled windings 200, 202, 204, 206. However, these windings may take up significant additional space within the filter, or if placed in close proximity, may exhibit significant magnetic coupling, complicating the design. Given these limitations, it is desirable to use a single winding to provide appropriate inductance compensation for two capacitors. It is also desirable to use only two windings to provide inductance compensation for three capacitors.

EXAMPLE

Figure 8A:
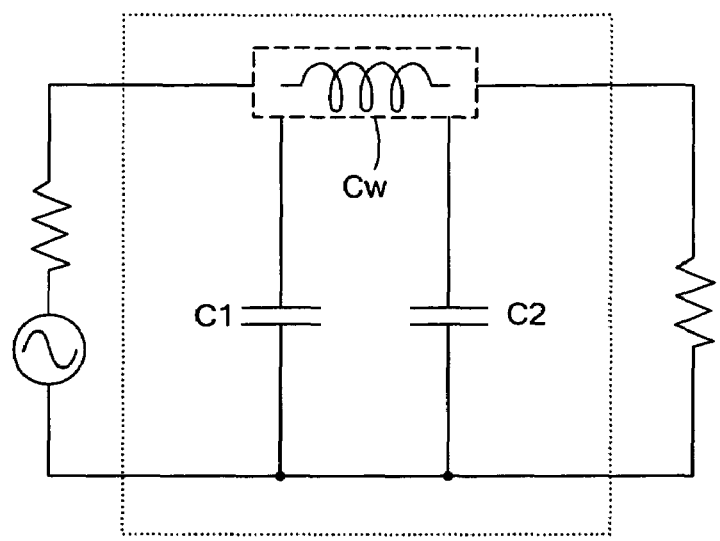
FIG. 8A is a circuit diagram of a circuit having first and second capacitors with inductance cancellation provided by a single coupled winding.

A test box was created with first and second capacitors C1, C2 and a planar coupled winding CW inside as shown in FIGS. 8A (circuit schematic) and 8B (illustrative fixture implementation). In the test fixture, two Panasonic ECKATS472ME6 4700pF Y2 class ceramic capacitors were used. This test box does not directly examine common and differential mode testing, however it does provide a straightforward example how a single coupled winding can support the compensation of inductance for two capacitors.

Figure 9:
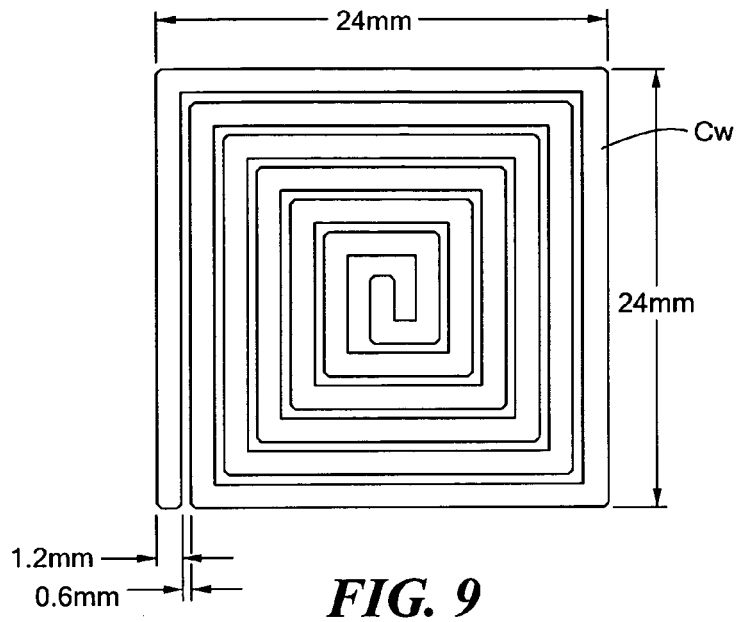
FIG. 9 is a schematic depiction of the coupled winding of FIG. 8A.

FIG. 9 shows an illustratively dimensioned drawing of the coil CW, which was cut using a water jet cutter from a single piece of 1 mm thick copper sheet. In the exemplary embodiment, the outer coil dimensions are 24 by 24 millimeters, a conductor width of about 1.2 millimeter, and a spacing of about 0.6 millimeter. It should be noted that this coil was intentionally far oversized for the amount of compensation required; the coil was designed in order to provide maximum design flexibility. It is understood that the coil CW can have a wide range of geometries and fabrication techniques to meet the needs of a particular application without departing from the invention.

An exemplary procedure for tuning the filter response of the two capacitors is now discussed. Initially, the first capacitor C1 is tuned to optimally compensate for its parasitic inductance by adjusting the connection point of the capacitor while observing the filter attenuation (e.g., with a network analyzer). Once the optimal position is found, the first capacitor C1 is attached to the cancellation winding CW. In one embodiment, the connection point of the first capacitor to the coupled winding circuit is selected by finding the connection point that minimizes the magnitude of an output signal when an input signal is applied. The second capacitor C2 is then tuned (with the first capacitor C1 in place) to find an optimal filter response. This gives one combination of capacitor locations on the coupled winding that results in a high performance filter characteristic.

Figure 8B:
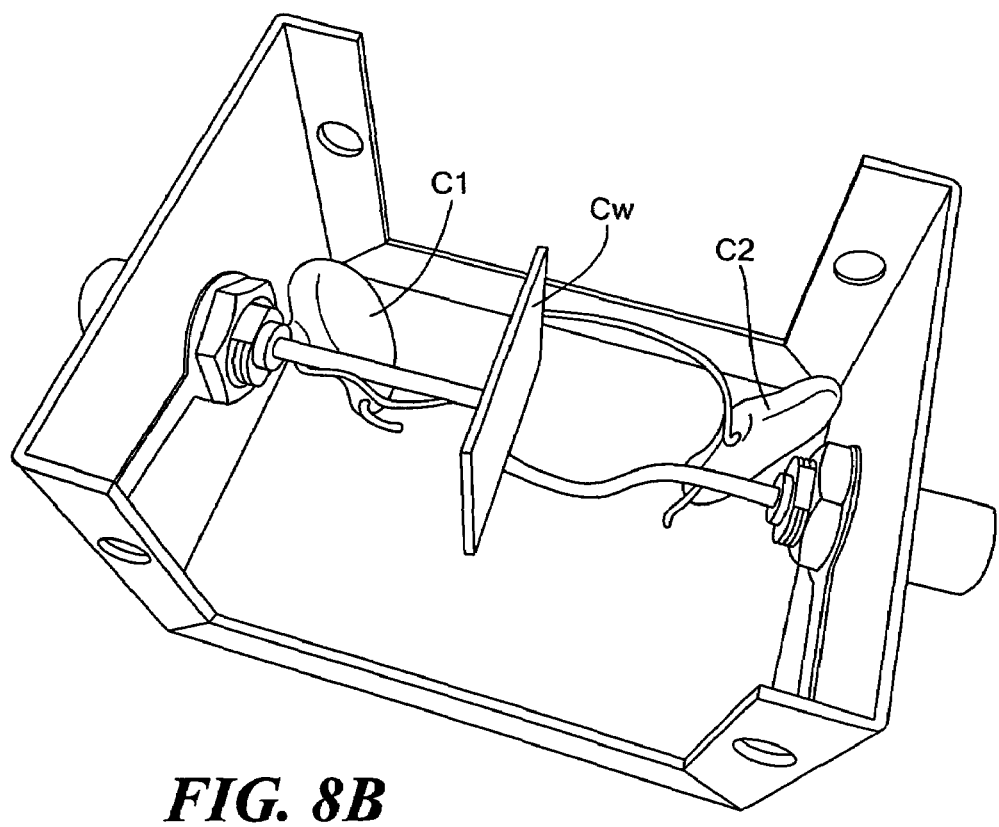
FIG. 8b is a pictorial representation of a test fixture for the circuit of FIG. 8A.
Figure 10:
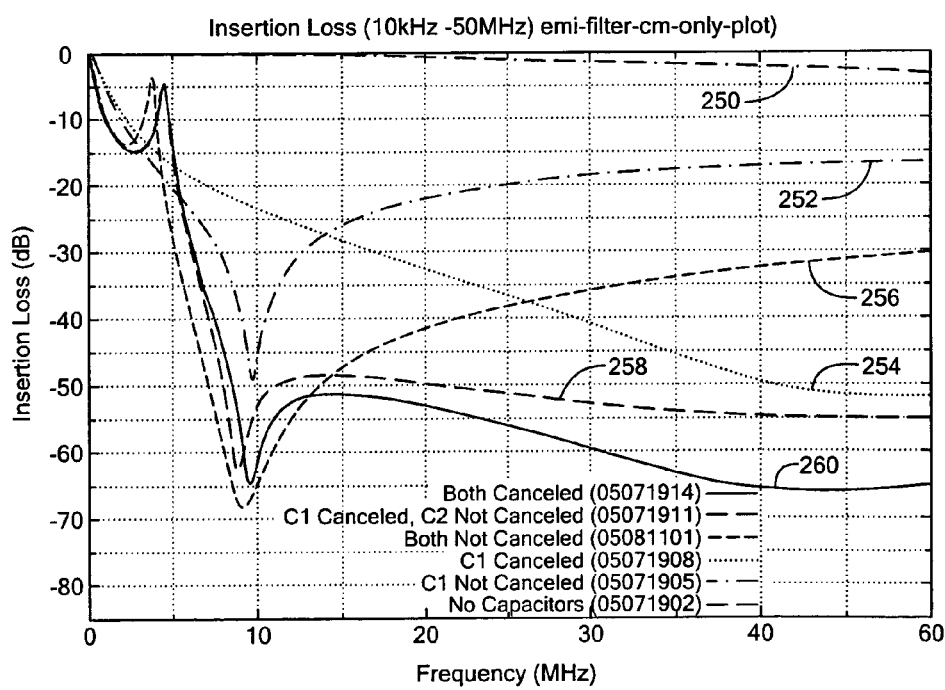
FIG. 10 is a graphical representation of insertion loss versus frequency from the test fixture of FIG. 8B.

FIG. 10 shows results for insertion loss versus frequency for the circuit and test fixture of FIGS. 8A and 8B. Measurements were made using an Agilent 4395A network analyzer, which provides 50Ω source and load impedances. Results are shown for no capacitors 250, C1 not canceled 252, C1 canceled 254, C1 and C2 not canceled 256, C1 canceled C2, not canceled 258, and C1 and C2 canceled 260.

To characterize the filter attenuation performance with different combinations of capacitor connections, measurements 250 were first taken without either capacitor connected to show the baseline filter response with only the coupled winding CW. When tuning the response with only C1, two measurements were taken for comparison: one with the capacitor connected directly at the input (source-side) terminal providing no cancellation, and one where the capacitor was connected to the cancellation coil CW at a location where the output response was optimal. The same approach was taken when tuning the response for the combination of C1 and C2; C2 was connected either directly at the filter output (response-side) terminal or at a position optimizing the filter response with both capacitors.

The characterization results of the filter attenuation performance 260 clearly show a dramatic improvement (as much as 35 dB at high frequency) from the case where no compensation is provided (Both Not Canceled) 256 to the case where inductance compensation is provided for both capacitors (Both Canceled) 260.

These results demonstrate that a single coupled magnetic winding CW can be used to provide inductance compensation for two capacitors C1, C2, with dramatic performance improvement at high frequencies.

When physically implementing multiple cancellation windings in a single filter, linked magnetic flux between the windings will affect the inductance cancellation and filter performance. As discussed above, FIG. 6 shows a test filter with balanced cancellation windings for a single capacitor. In a more compact design, or those with larger coils, flux linkage effects may be increased substantially.

Figure 11:
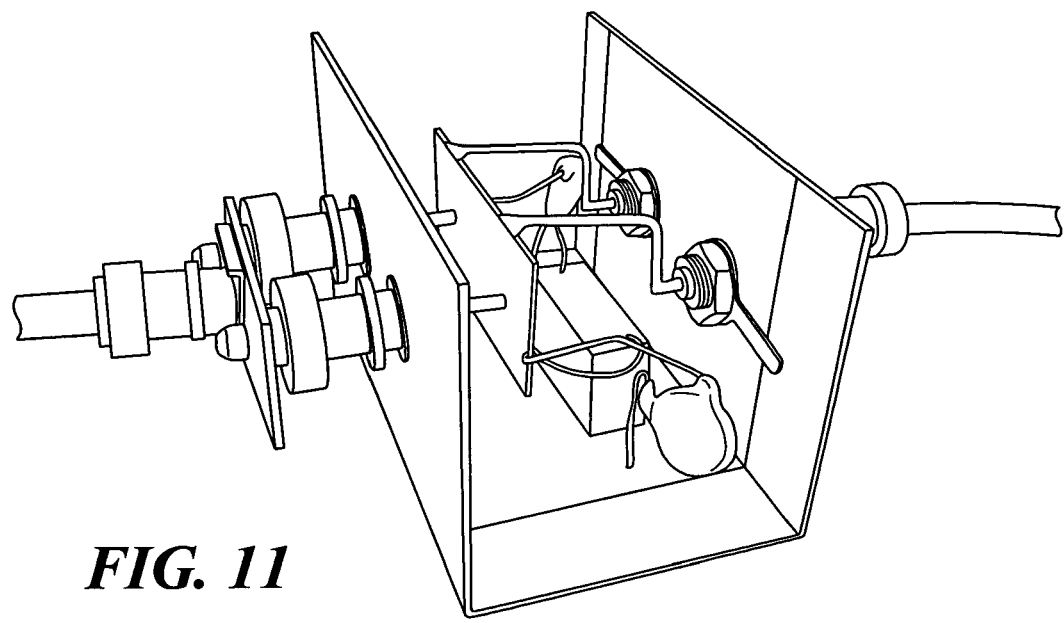
FIG. 11 is a pictorial representation of a test box to test coupled inductance cancellation.
Figure 12A:
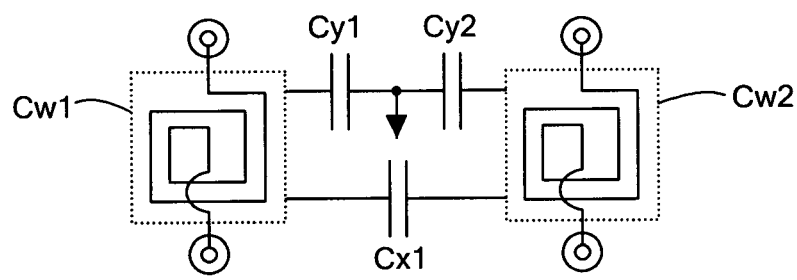
FIG. 12A is a schematic representation of a circuit having coupled inductance cancellation coils in the same direction.
Figure 12B:
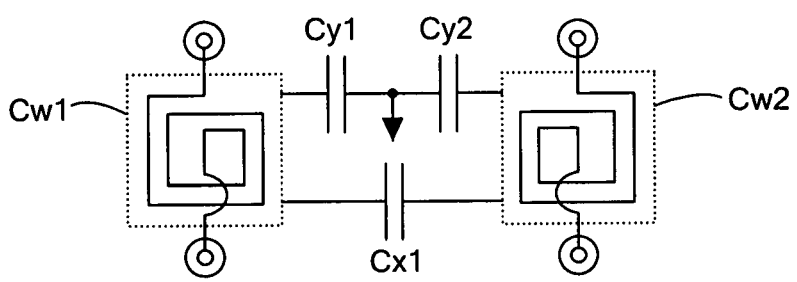
FIG. 12B is a schematic representation of a circuit having coupled inductance cancellation coils in the opposite direction.
Figure 13A:
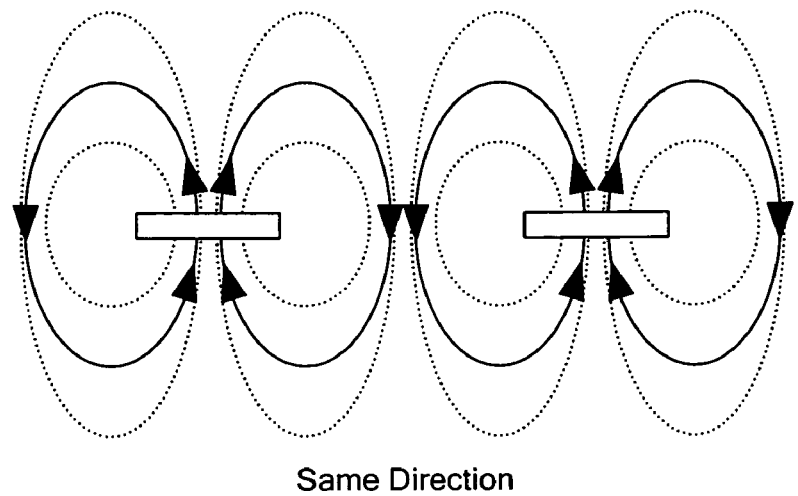
FIG. 13A is a schematic representation of flux patterns for coupled inductance cancellation coils in the same direction.
Figure 13B:
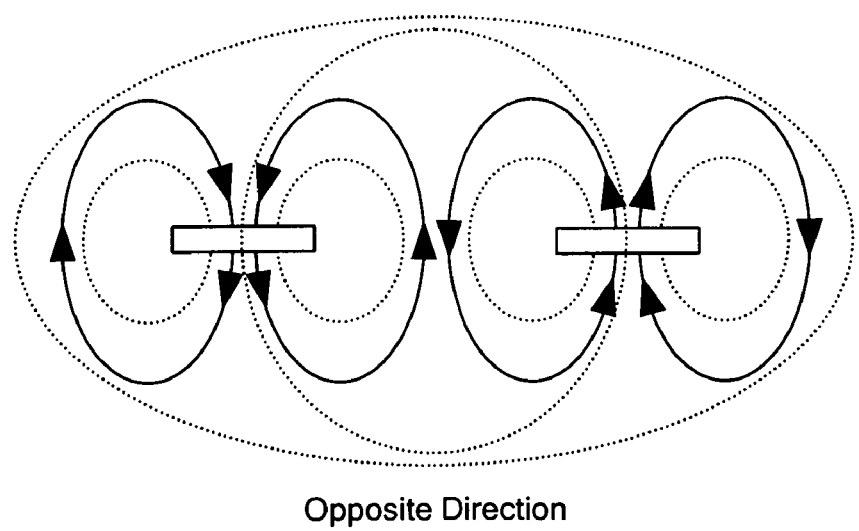
FIG. 13B is a schematic representation of flux patterns for coupled inductance cancellation coils in the opposite direction.

Based on the test box in FIG. 8B, two additional boxes (using the same winding structure as the first box) were created to test two general coupling cases. FIG. 11 shows the test box and its internal layout.

FIGS. 12A-B and 13A-B illustrate the difference between the two coupling cases. When considered from a common mode perspective, windings CW1, CW2 placed in the same direction (FIG. 12A) throw flux in a way that opposes the flux of the other winding. For coils CW1, CW2 wrapped in the opposite direction (FIG. 12B), the flux from one winding is reinforced by the other acting in a manner similar to a common-mode choke.

The illustrative tuning procedure described here is similar to the two-capacitor case, except that there are now two common-mode capacitors Cy1, Cy2 that are tuned in the same step. Initially, capacitors Cy1 and Cy2 are tuned simultaneously in the common-mode case to compensate for their parasitic inductances. Once the optimal positions are found, the common-mode capacitors Cy1, Cy2 are attached to their respective windings CW1, CW2. Following this, the differential mode capacitor Cx1 is tuned in the differential mode case by moving its connections on both coils (symmetrically or asymmetrically) to find an optimal output response.

Figure 14A:
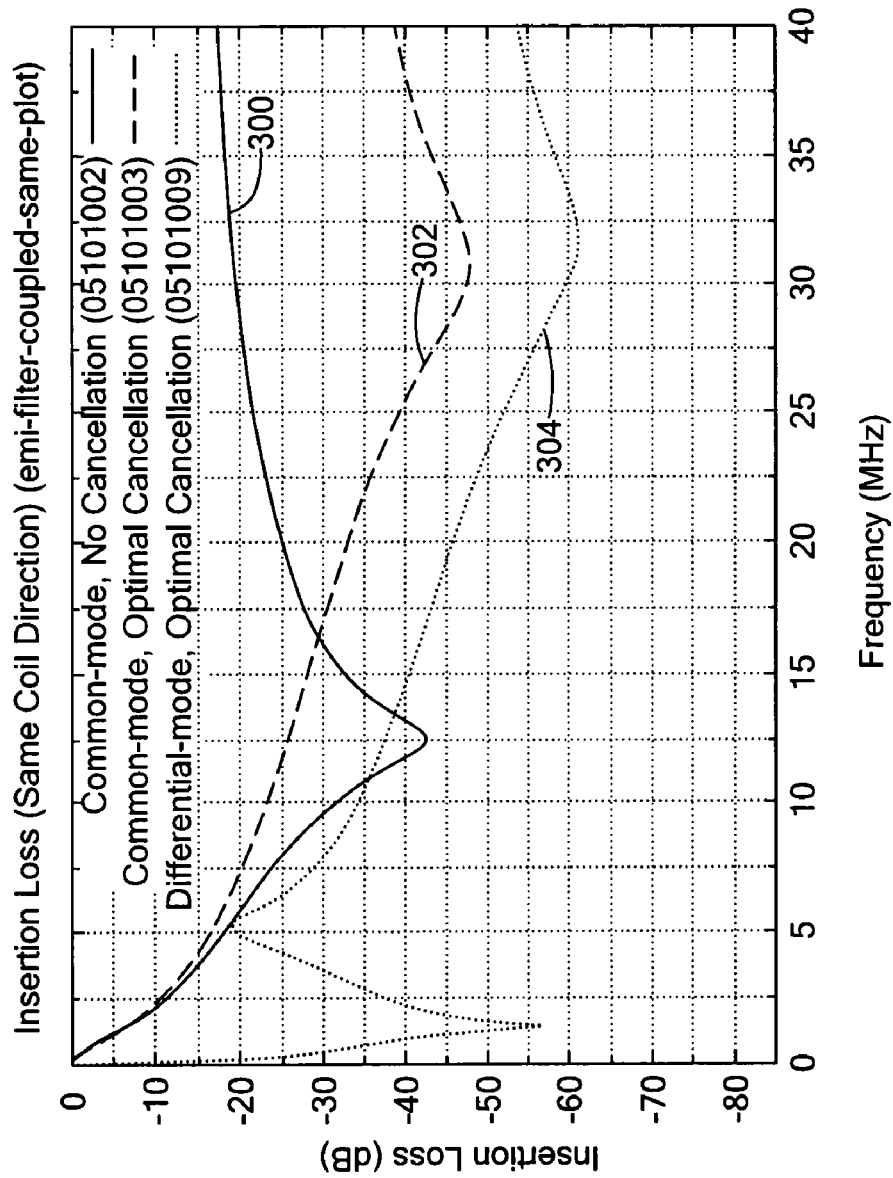
FIG. 14A is a graphical depiction of insertion loss of coupled inductance cancellation windings in the same direction.
Figure 14B:
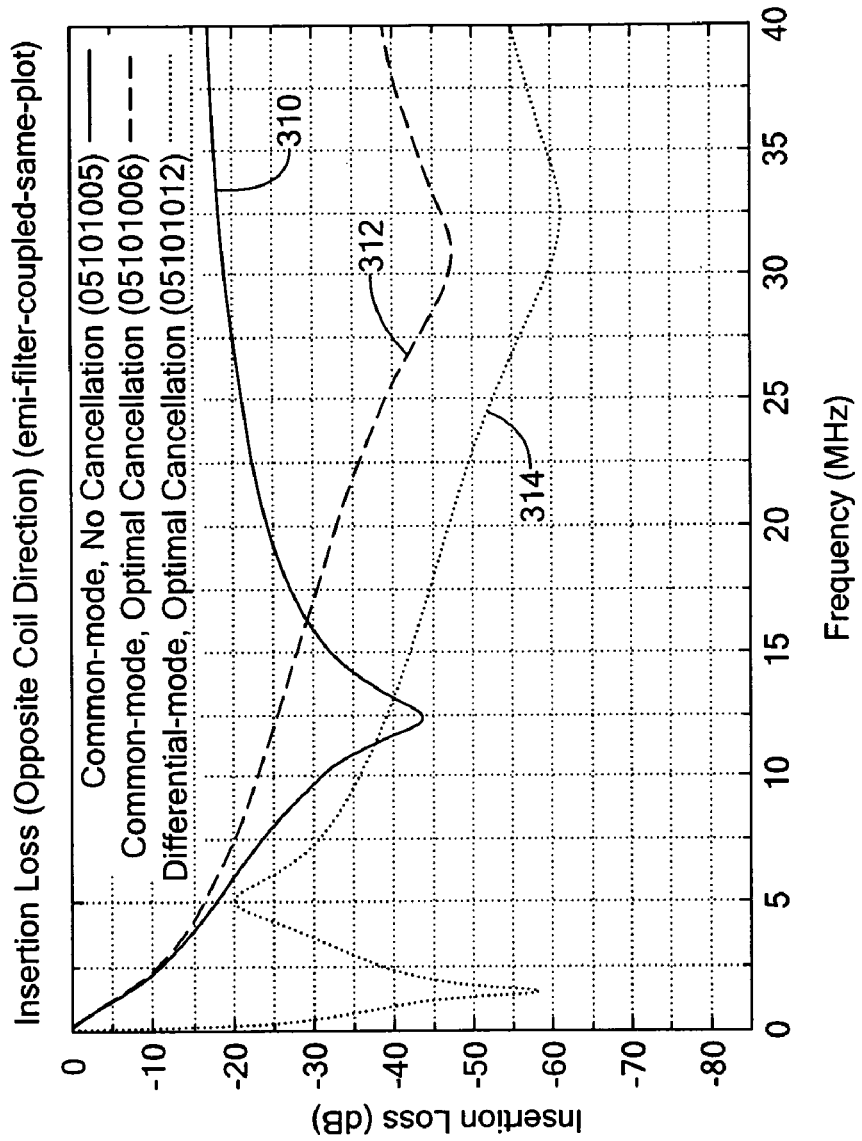
FIG. 14B is a graphical depiction of insertion loss of coupled inductance cancellation windings in the opposite direction.

FIGS. 14A and 14B show the results for the same and opposite direction cases, respectively. FIG. 14A shows the insertion loss for same direction coils for common mode no cancellation 300, common mode optimal cancellation 302, and differential mode optimal cancellation 304. FIG. 14B shows the insertion loss for opposite direction coils for common mode no cancellation 310, common mode optimal cancellation 312, and differential mode optimal cancellation 314. It can be seen that in this case, the relative winding orientations do not have a significant impact on the achievable filtration performance. It is understood, however, that the impact of the relative winding orientations may vary with the geometry and fabrication of the coupled windings without departing from the invention.

Having discussed above that a single inductance cancellation winding can be used with two capacitors to improve filter performance, its use in the context of common and differential mode EMI filtering is examined below

EXAMPLE

Figure 15A:
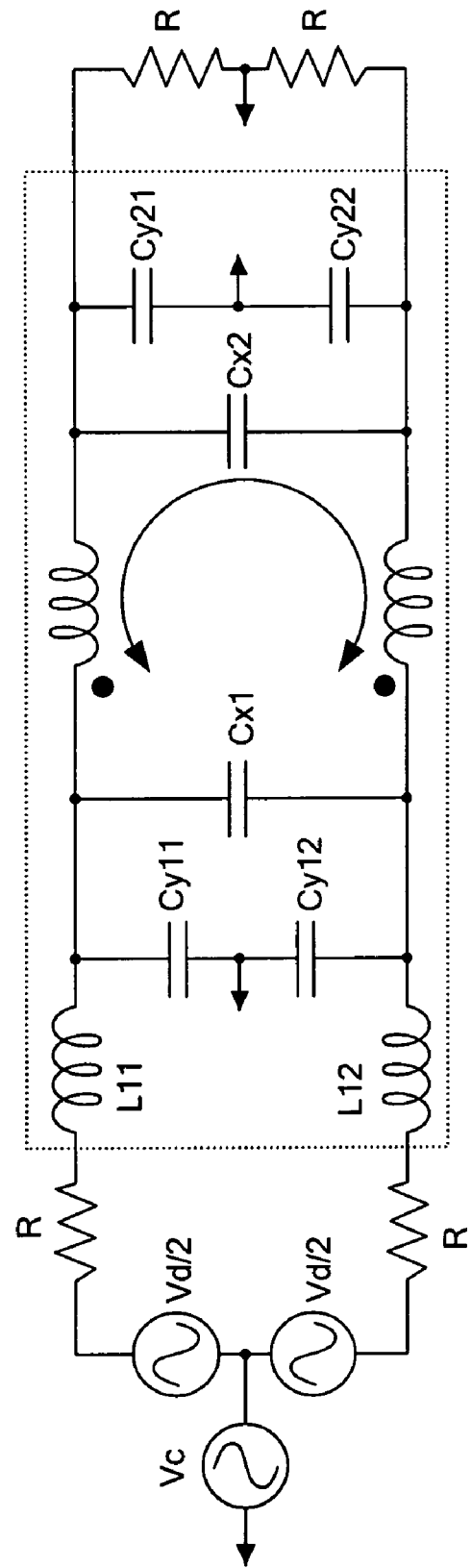
FIG. 15A is a schematic representation of a commercially available EMI filter.
Figure 15B:
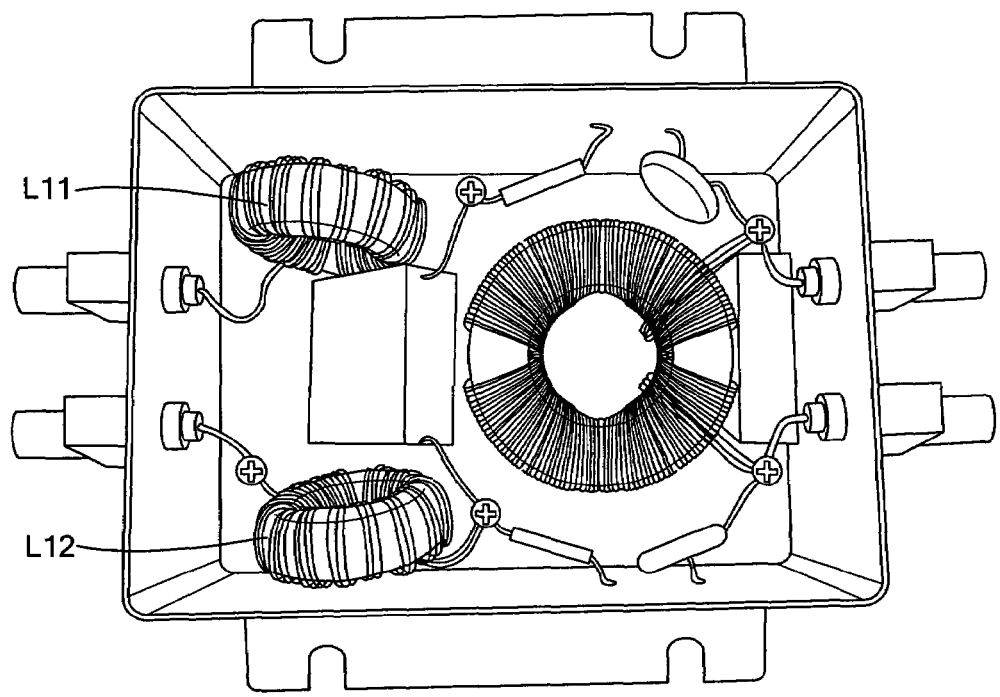
FIG. 15B is a pictorial representation of the EMI filter of FIG. 15A.

A commercially available filter was used as a starting point as shown in FIG. 15A, which shows a filter schematic, and FIG. 15B, which shows a pictorial representation of the filter. As can be seen in FIG. 15B, the relatively large (15 μH) series inductors L11 and L12 are particularly bulky, heavy, and expensive components of the commercial filter. Thus, it would be desirable to eliminate them while preserving filter performance. In the illustrated filter, exemplary component values are set forth below in Table 1:

TABLE 1

| Component | Impedance Values Value |
|---|---|
| L11, L12 | 15 μH |
| CY11, CY12 | 47 nF film capacitor |
| CX1, CX2 | 2.2 μF film capacitor |
| CY21, CY22 | 15 nF ceramic capacitor |

Figure 16A:
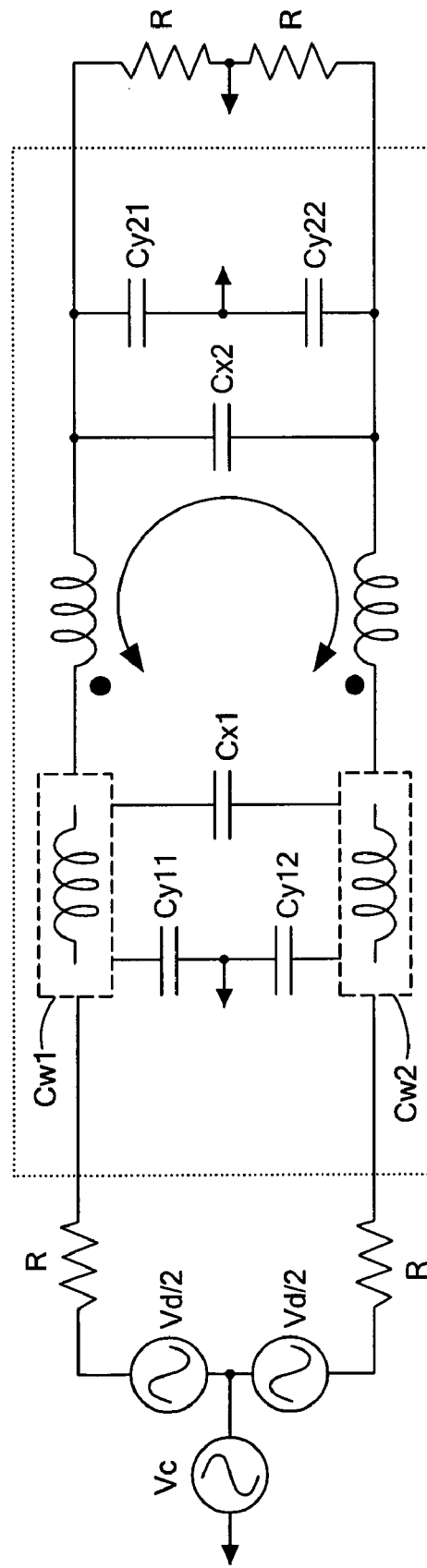
FIG. 16A is a schematic representation of an EMI filter having inductance cancellation of multiple capacitors in accordance with the present invention.
Figure 16B:
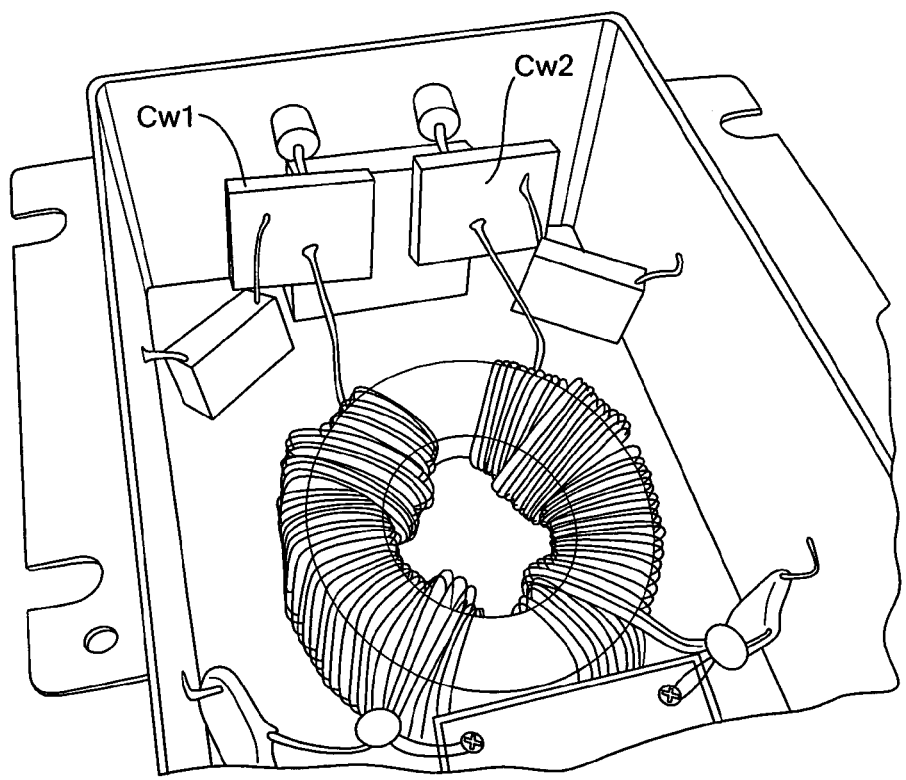
FIG. 16B is a pictorial representation of an EMI filter having inductance cancellation of multiple capacitors in accordance with the present invention.

As shown in FIGS. 16A (schematic) and 16B (pictorial representation), the series inductors (L11, L12 of FIG. 15B) were thus removed to provide working space for installing inductance cancellation windings CW1, CW2. Removal of the series inductors is offset through use of the significantly smaller cancellation windings CW1, CW2, which each have a total inductance on the order of 300 nH.

Common and differential mode measurements were taken of the unmodified filter of FIG. 15B, as well as an intermediate step before the inductance cancellation winding were installed. In this intermediate step, the large inductors L11 and L22 were removed and straight solid 14-gauge wire was installed in their place. This configuration, referred to here as 'Without Series Inductor' was used as a baseline comparison for improvements based on inductance cancellation.

The tuning procedure outlined here is similar as that described above for the circuit of FIG. 12A and directed to tuning the filter response of common and differential mode capacitors. Initially, common-mode capacitors Cy11, Cy12 are tuned simultaneously to compensate (in a symmetric fashion) for their parasitic inductances. Once the optimal positions are found, the capacitors Cy11, Cy12 are permanently attached to their respective windings. Following this, the differential-mode capacitor Cx1 is tuned by moving its connections on both coils (symmetrically or asymmetrically) to find an optimal output response. This order of tuning makes sense: in the case of an EMI filter, the common and differential mode capacitors do not impact system performance in the same way. In FIG. 7A described above it is shown that the common mode equivalent circuit is not influenced by the differential mode capacitance (or the inductance cancellation, other than the fixed series inductance introduced by the cancellation winding); the common-mode filtration operates as if the differential-mode capacitor were an open circuit. However, the differential mode filtration is dependent on the common mode capacitance and inductance cancellation. Thus, if the inductance cancellation for the common-mode capacitance is optimized first, the inductance compensation for the differential mode capacitor can be tuned subsequently without influencing the common mode performance.

Figure 17A:
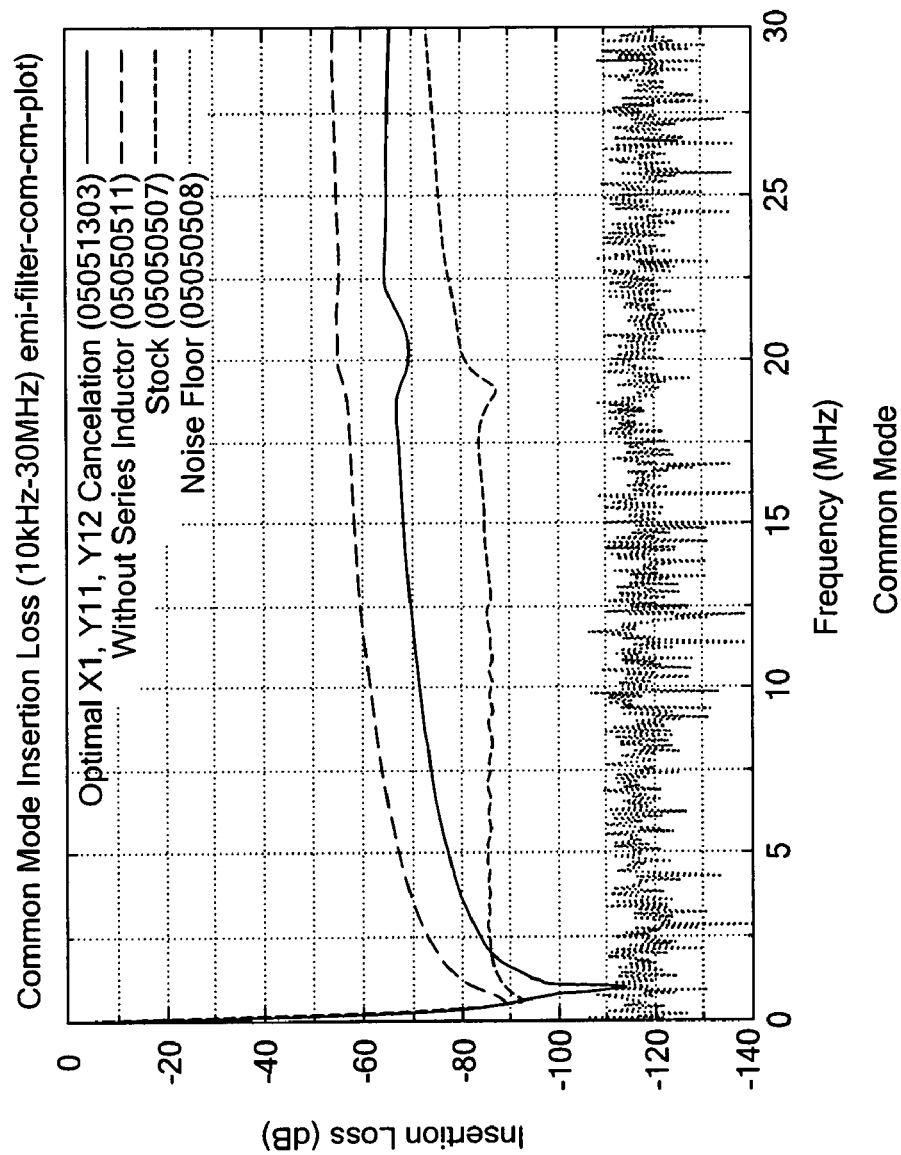
FIG. 17A is a graphical representation of common mode insertion loss versus frequency with and without inductance cancellation.
Figure 17B:
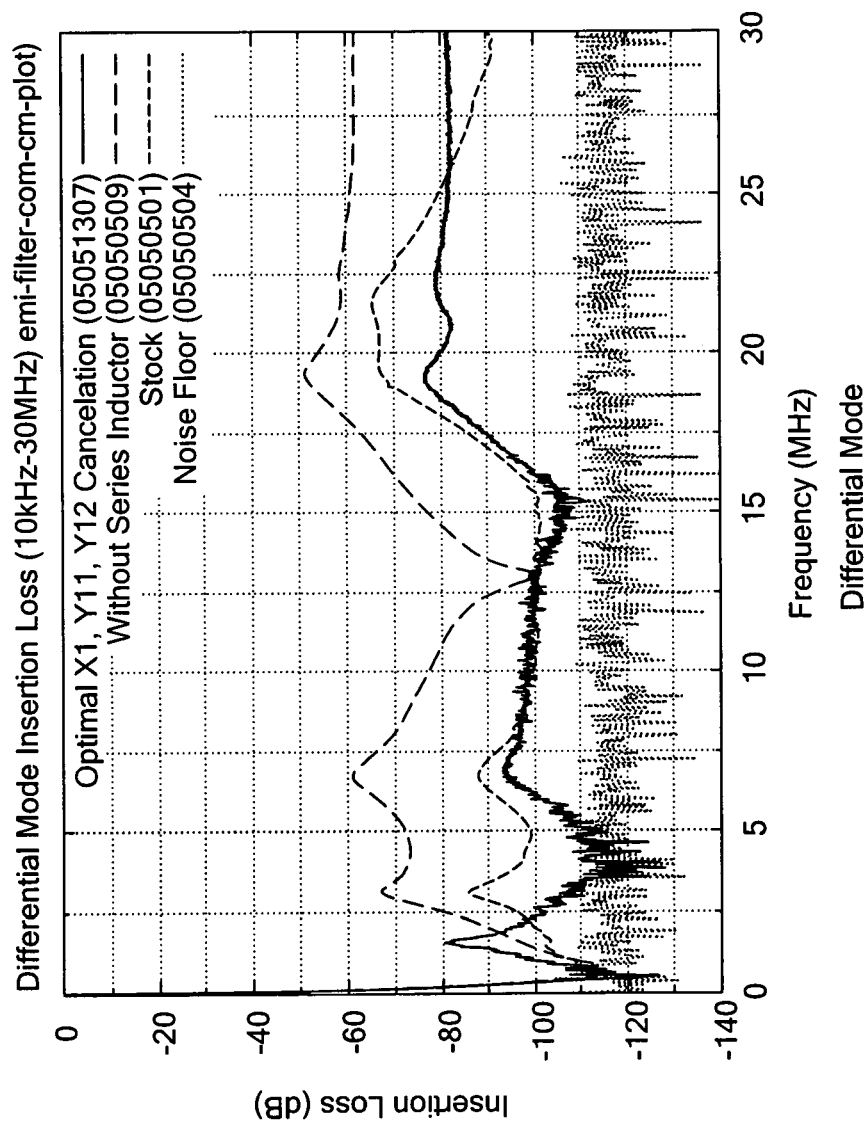
FIG. 17B is a graphical representation of differential mode insertion loss versus frequency with and without inductance cancellation.

The results of the completed tuning are shown in FIGS. 17A (common mode) and 17B (differential mode) along with baseline filter and stock filter configurations. It should be noted that tuning both the common and differential modes is based on compromises between high and low frequency performance. This particular optimal output response chosen here may not be the highest achievable performance for another particular range of frequencies This is also influenced by the symmetry of connections Cx1 has with the two coils in the process of tuning.

The result of incorporating the inductance cancellation coils show a dramatic improvement in the filtration performance for both common and differential modes with the large differential-mode inductors removed. The common mode shows improvement across its full range, and the differential mode shows improvement over its full range except for the small resonance around 2 MHz. The performance with the inductance cancellation windings exceeded the required performance specification of the stock filter, without requiring the large, expensive series inductors of the stock filter. One interesting aspect of the differential mode performance is that the inductance-compensated version has equal or better performance than the stock filter (with the large series inductors) except for the small resonance.

The results from this commercial EMI filter, as well as those from the test box in FIG. 8, show clearly that a single magnetically coupled winding can provide effective inductance compensation for two capacitors, and that two coupled windings can provide effective inductance cancellation for three capacitors.

Analysis of inductance cancellation windings with a single capacitor is relatively straightforward since one can use a two port transformer for the windings, which has only three independent terms. The number of independent terms needed to completely describe coupled magnetics with n terminals is given by $n(n+1)/2$, which grows as the square of n.

Adding to the complexity is the fact that many models for multiple winding transformers either do not adequately model real-world behavior or have poor correlation and numeric conditioning to attempted measurements or model parameters. One model that is effective, and well conditioned for experimental parameter extraction, is the Extended Cantilever Model, which is well known to one of ordinary skill in the art.

Figure 18:
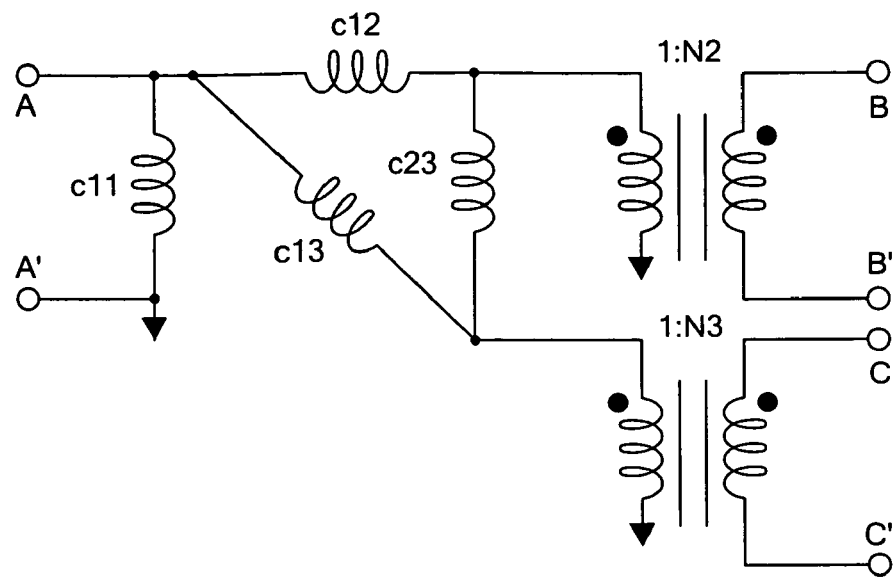
FIG. 18 is a schematic representation of a three-port extended cantilever model of a coupled magnetic circuit.

The Extended Cantilever Model of a coupled system yields an equivalent circuit with directly measurable parameters and provides a direct mapping between circuit parameters and the inductance matrix parameters. It is also well conditioned numerically when dealing with small leakage fluxes or high coupling factors. The extended cantilever circuit model for a three-port system is shown in FIG. 18, with circuit parameters related to impedance matrix parameters as follows:

$$b = \qquad (1)$$

$$n_2 = \frac{Z_{12}}{Z_{11}} \qquad (2)$$

$$n_3 = \frac{Z_{13}}{Z_{11}} \qquad (3)$$

$$c_{11} = Z_{11} \qquad (4)$$

$$c_{12} = -\frac{1}{n_1 n_2 b_{12}} \qquad (5)$$

$$c_{23} = -\frac{1}{n_2 n_3 b_{23}} \qquad (6)$$

$$c_{13} = -\frac{1}{n_1 n_3 b_{13}} \qquad (7)$$

Figure 19:
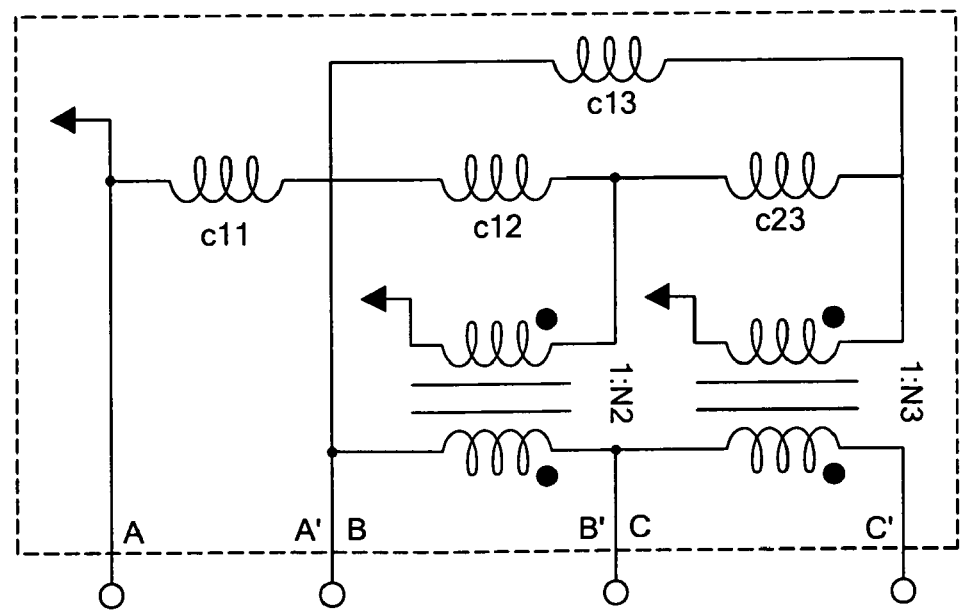
FIG. 19 is a schematic representation of a three-port extended cantilever model in tapped inductor configuration.
Figure 20:
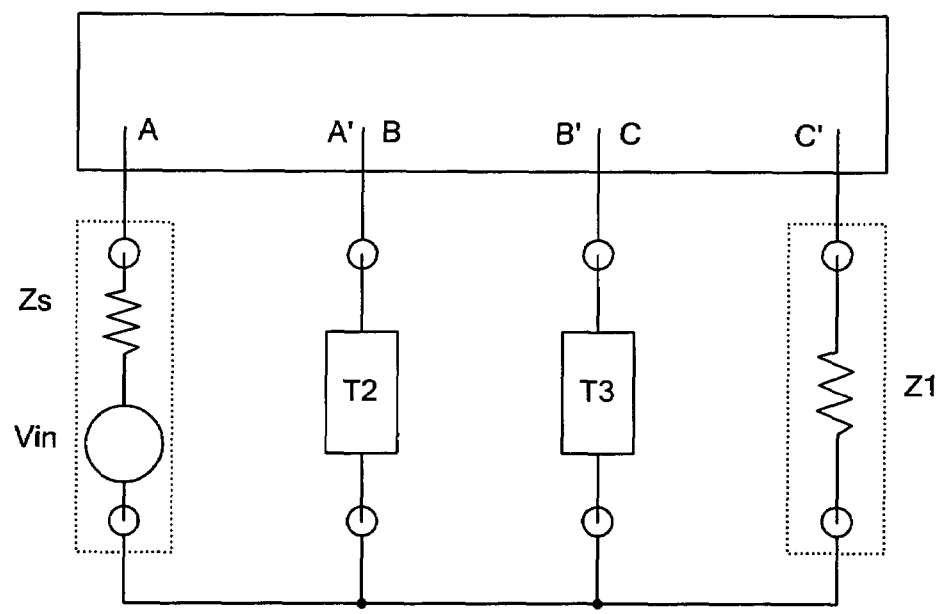
FIG. 20 is a schematic representation of a shared terminal three-port circuit for use with the extended cantilever model tapped inductor configuration.

FIG. 19 shows the application of the extended cantilever model to a center-tapped cancellation winding circuit with two tap points. FIG. 20 shows the circuit model including tap capacitors and source and load networks. As set forth in the below equations, the transfer function from input voltage to load voltage for the circuit in FIG. 20 was found using direct circuit analysis, with the source network consisting of an input voltage source $V_{in}$ with series impedance $z_s$ and a load network comprised of an impedance $z_l$. $T_2$ and $T_3$ are arbitrary impedances representing the two capacitors.

$$H_{(s)} = \frac{((T_2 - Z_{13} - Z_{12})T_3 + (-Z_{23} - Z_{13})T_2 + Z_{12}Z_{23} - Z_{13}Z_{22})z_l}{\begin{array}{c}((T_3 + T_2 Z_{22})z_l + (T_2 + Z_{33} + 2Z_{23} + Z_{22})T_3 + Z_{33}T_2 + Z_{22}Z_{33} - Z_{23}^2)z_s + \\ ((T_2 + Z_{11})T_3 + (Z_{22} + 2Z_{12} + Z_{11})T_2 + Z_{11}Z_{22} - Z_{12}^2)z_l + \\ ((Z_{33} + 2Z_{23} + Z_{22} + 2Z_{13} + 2Z_{12} + Z_{11})T_2 + \\ Z_{11}Z_{33} + 2Z_{11}Z_{23} + Z_{11}Z_{22} - Z_{13}^2 - 2Z_{12}Z_{13} - Z_{12}^2)T_3 + \\ ((Z_{22} + 2Z_{12} + Z_{11})Z_{33} - Z_{23}^2 - 2Z_{13}Z_{23} - Z_{13}^2)T_2 + \\ (Z_{11}Z_{22} - Z_{12}^2)Z_{33} - Z_{11}Z_{23}^2 + 2Z_{12}Z_{13}Z_{23} - Z_{13}^2 Z_{22}\end{array}} \quad (8)$$

By analogy to the case for cancellation with a single capacitor, it is desired to find conditions that drive this transfer function to zero (or close to zero) when the impedances $T_2$ and $T_3$ are the equivalent series impedances of the two capacitor paths. Finding where the transfer function goes to zero, the numerator of the transfer function is the point of interest. The goal of making the transfer function zero can be accomplished by finding conditions where the numerator is zero, and where the denominator remains non-zero. Starting from the numerator of Equation 8, one finds:

$$0 = z_l((T_2 - Z_{13} - Z_{12})T_3 + (-Z_{23} - Z_{13})T_2 + Z_{12}Z_{23} - Z_{13}Z_{22}) \quad (9)$$

refactoring and dividing by the (non-zero) value of $z_l$:

$$0 = Z_{13}(Z_{12} + Z_{23} + Z_{13} + Z_{22}) - (T_2 - Z_{12} - Z_{13})(T_3 - Z_{13} - Z_{23}) \quad (10)$$

Equation 10 gives two degrees of freedom in which to generate a zero. An optimal relationship can be found for any two impedances $T_2$ and $T_3$. However in the case of common mode and differential mode filtering there are additional constraints to be considered.

As described above, in the case of an EMI filter, the common and differential mode capacitors do not impact system performance in the same way. In FIG. 7A it is shown that the common mode equivalent circuit is not influenced by the differential mode capacitance (or the inductance cancellation, other than the fixed series inductance introduced by the cancellation winding); the common-mode filtration operates as if the differential-mode capacitor were an open circuit. However, the differential mode filtration is dependent upon the common mode capacitance and inductance cancellation. This means that if the inductance compensation for the common-mode capacitance is optimized first, the inductance compensation for the differential mode capacitor can be tuned subsequently without influencing the common mode performance.

To find the optimal cancellation for the common mode capacitors, the transfer function in Equation 10 is considered when $T_3 = \infty$ (since the differential-mode capacitance is a virtual open circuit for common-mode signals).

$$H_{(s)} = \frac{(T_2 - Z_{13} - Z_{12})z_l}{\begin{array}{c}(z_l + T_2 + Z_{33} + 2Z_{23} + Z_{22})z_s + (T_2 + Z_{11})z_l + \\ (Z_{33} + 2Z_{23} + Z_{22} + 2Z_{13} + 2Z_{12} + Z_{11})T_2 + \\ Z_{11}Z_{33} + 2Z_{11}Z_{23} + Z_{11}Z_{22} - Z_{13}^2 - 2Z_{12}Z_{13} - Z_{12}^2\end{array}} \quad (11)$$

From this result, it is shown that if $T_2 = Z_{12} + Z_{13}$ then full cancellation in the common-mode can be achieved. If this result is then taken along with the original transfer function in Equation 10, one finds:

$$H_{(s)} = -\frac{(Z_{13}Z_{23} + Z_{13}Z_{22} + Z_{13}^2 + Z_{12}Z_{13})z_l}{\begin{array}{c}((T_3 + Z_{22} + Z_{13} + Z_{12})z_l + \\ (Z_{33} + 2Z_{23} + Z_{22} + Z_{13} + Z_{12})T_3 + \\ (Z_{22} + Z_{13} + Z_{12})Z_{33} - Z_{23}^2)z_s + \\ ((Z_{13} + Z_{12} + Z_{11})T_3 + (Z_{13} + Z_{12} + Z_{11})Z_{22} + \\ (2Z_{12} + Z_{11})Z_{13} + Z_{12}^2 + Z_{11}Z_{12})z_l + \\ ((Z_{13} + Z_{12} + Z_{11})Z_{33} + (2Z_{13} + 2Z_{12} + 2Z_{11})Z_{23} + \\ (Z_{13} + Z_{12} + Z_{11})Z_{22} + Z_{13}^2 + (2Z_{12} + Z_{11})Z_{13} + \\ Z_{12}^2 + Z_{11}Z_{12})T_3 + \\ ((Z_{13} + Z_{12} + Z_{11})Z_{22} + (2Z_{12} + Z_{11})Z_{13} + \\ Z_{12}^2 + Z_{11}Z_{12})Z_{33} + (-Z_{13} - Z_{12} - Z_{11})Z_{23}^2 - \\ 2Z_{13}^2 Z_{23} - Z_{13}^2 Z_{22} - Z_{13}^3 - Z_{12}Z_{13}^2\end{array}} \quad (12)$$

which leaves the requirement of $$0 = Z_{13}(Z_{12} + Z_{23} + Z_{13} + Z_{22}) \quad (13)$$

to make the transfer function zero. This result contains no terms of $T_3$ in which to tune in comparison to the terms of the impedance matrix. Additionally, the terms of the impedance matrix in the center tapped configuration are positive. This seems to give no opportunity for the numerator to become zero, save for the possibility of making $Z_{13} = 0$. If $Z_{13}$ becomes zero, and thus the transfer function numerator as well, the denominator becomes $$(T_3 z_l + Z_{22} z_l + Z_{12} z_l + Z_{33} T_3 + 2Z_{23} T_3 + Z_{22} T_3 + Z_{12} T_3 + Z_{22}Z_{33} + Z_{12}Z_{33} - Z_{23}^2)(z_s + Z_{12} + Z_{11}) \quad (14)$$

which is finite, and thus $Z_1 = 0$ does represent a zero for the transfer function.

It is known that depending on the frequency range of interest, the performance with imperfect cancellation may be significantly better than the uncanceled case. In this case a new term $\Delta_2$ can be defined as the residual shunt path impedance of the capacitor. More specifically, $\Delta_2 = T_2 - (Z_{12} + Z_{13})$. If this is substituted into Equation 10, and the resulting equation massaged a bit, Equation 15 results giving a relation where $Z_{13}$ is not explicitly required to be zero for the transfer function to be zero.

$$0 = Z_{13}(T_2 + Z_{22} + Z_{23}) - \Delta_2(T_3 - Z_{23}) \quad (15)$$

Hence, one may gain good performance in both common-mode and differential-mode by realizing substantial (but not perfect) cancellation in common-mode to benefit differential-mode performance.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A filter comprising:
   first and second capacitors; and
   a circuit coupled to the first and second capacitors, the circuit including a discrete magnetically-coupled winding to compensate for equivalent series inductance effects of a first capacitor electrical path including the first capacitor and a second capacitor electrical path including the second capacitor,
   wherein the first capacitor is connected to the discrete magnetically coupled winding at a first connection point and the second capacitor is connected to the discrete magnetically-coupled winding at a second connection point,
   wherein induction of the magnetically-coupled winding generates voltages that counteract voltages due to equivalent series inductance of the first and second capacitor electrical paths and do not counteract voltages due to capacitances of the first and second capacitors.

2. The filter according to claim 1, wherein the coupled winding nullifies the equivalent series inductance effect of the first capacitor electrical path, wherein the effects of capacitance of the first capacitor is not nullified.

3. The filter according to claim 1, wherein the first capacitor is adapted to attenuate a common-mode signal and the second capacitor is adapted to attenuate a differential-mode signal.

4. The filter according to claim 1, further including a third capacitor coupled to a further circuit containing a discrete magnetically coupled winding.

5. The filter according to claim 4, wherein the first and third capacitors are adapted to attenuate a common-mode signal and the second capacitor is adapted to attenuate a differential-mode signal.

6. The filter according to claim 1, wherein the discrete magnetically-coupled winding links a portion of the magnetic flux due to currents in at least one of the first and second capacitors.

7. A method of suppressing electrical signals, comprising:
   coupling a first capacitor having at least first and second ends to a circuit including a discrete magnetically-coupled winding at a first connection point; and coupling a second capacitor having at least first and second ends to the coupled magnetic winding circuit at a second connection point, wherein the discrete magnetically-coupled winding compensates for an effect of an equivalent series inductance of paths through the first and second capacitors, wherein an effect of the capacitances of the first and second capacitors is not compensated for.

8. The method according to claim 7, further including selecting the first connection point of the first capacitor to the coupled winding circuit by minimizing a magnitude of an output signal when an input signal is applied before the second capacitor is coupled to the discrete magnetically-coupled winding.

9. The method according to claim 7, further including selecting the second connection point of the second capacitor to the coupled winding circuit by minimizing a magnitude of a output signal when an input signal is applied.

10. The method according to claim 7, further including selecting the second connection point of the second capacitor to the coupled winding circuit by minimizing a magnitude of an output signal when an input signal is applied with the first capacitor disconnected from the coupled winding circuit.

11. The method according to claim 8, further including selecting the second connection point of the second capacitor to the coupled winding circuit by minimizing the magnitude of the output signal when the input signal is applied.

12. The method according to claim 8 wherein the first capacitor is adapted to attenuate a common-mode signal and the second capacitor is adapted to attenuate a differential-mode signal.

13. The method according to claim 7, further including coupling a third capacitor having at least first and second ends to a further circuit including a discrete magnetically-coupled winding, wherein the discrete magnetically-coupled winding of the further circuit compensates for an effect of an equivalent series inductance of a path throuqh the third capacitor.

14. The method according to claim 13 wherein at least one of the first, second, and third capacitors is adapted to attenuate a differential-mode signal and at least two of the first, second, and third capacitors are adapted to attenuate a common-mode signal.

15. A filter, comprising:
   a circuit including a first discrete magnetically-coupled winding, the first magnetically-coupled winding having at least first and second capacitor tap points;
   a first capacitor having a first end connected to the first capacitor tap point; and
   a second capacitor having a first end connected to the second capacitor tap point,
   wherein induction of the first magnetically-coupled winding provides cancellation of an effect of an equivalent series inductance of a first path through the first capacitor and an equivalent series inductance of a second path though the second capacitor, wherein an effect of capacitances of the first and second capacitors is not cancelled.

16. The filter according to claim 15 further including
   a second discrete magnetically-coupled winding having at least first and second capacitor tap points; and
   a third capacitor having a first end connected to the first capacitor tap point of the second discrete magnetically-coupled winding, such that the induction of the second magnetically-coupled winding provides cancellation of an effect of an equivalent series inductance of a path through the third capacitor.

17. The filter according to claim 16 further including having a second end of the second capacitor connected to the second capacitor tap point of the second discrete magnetically-coupled winding.

18. The filter according to claim 17 wherein the magnetic induction of the first and second magnetically-coupled windings in response to a differential excitation provides compensation of the effect of the equivalent series inductance of a path through the second capacitor.

19. The filter according to claim 15, wherein the first magnetically-coupled winding includes a substantially non-magnetic core.

20. The filter according to claim 16, wherein the discrete magnetically-coupled magnetic windings are formed in a printed circuit board.

* * * * *

UNITED STATES PATENT AND TRADEMARK OFFICE
CERTIFICATE OF CORRECTION

PATENT NO. : 7,589,605 B2 Page 1 of 1
APPLICATION NO. : 11/354628
DATED : September 15, 2009
INVENTOR(S) : David J. Perreault et al.

It is certified that error appears in the above-identified patent and that said Letters Patent is hereby corrected as shown below:

Abstract, line 3, delete "capacitors," and replace with --capacitor,--.

Fig. 3 does not show reference number "104".

Column 1, line 60, delete "winding" and replace with --windings--.

Column 2, line 43, delete "though" and replace with --through--.

Column 5, line 3, delete "example how" and replace with --example of how--.

Column 7, line 10, delete "winding" and replace with --windings--.

Column 7, line 53, delete "frequencies this" and replace with --frequencies. This--.

Column 11, line 48, delete "of the capacitances" and replace with --of capacitances--.

Signed and Sealed this

Seventeenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,589,605 B2
APPLICATION NO. : 11/354628
DATED : September 15, 2009
INVENTOR(S) : Perreault et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 204 days.

Signed and Sealed this

Twenty-first Day of September, 2010

David J. Kappos
*Director of the United States Patent and Trademark Office*